United States Patent
Chen et al.

(10) Patent No.: US 10,269,923 B2
(45) Date of Patent: Apr. 23, 2019

(54) HEMTS WITH AN ALXGA1-XN BARRIER LAYER GROWN BY PLASMA ENHANCED ATOMIC LAYER DEPOSITION

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Miin-Jang Chen, Taipei (TW); Wei-Hao Lee, Taipei (TW); Huan-yu Shih, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/703,491

(22) Filed: Sep. 13, 2017

(65) Prior Publication Data
US 2018/0108753 A1 Apr. 19, 2018

Related U.S. Application Data

(60) Provisional application No. 62/410,167, filed on Oct. 19, 2016.

(51) Int. Cl.
*H01L 29/66* (2006.01)
*C23C 16/455* (2006.01)
(Continued)

(52) U.S. Cl.
CPC ...... *H01L 29/66462* (2013.01); *C23C 16/303* (2013.01); *C23C 16/4408* (2013.01);
(Continued)

(58) Field of Classification Search
None
See application file for complete search history.

(56) References Cited

U.S. PATENT DOCUMENTS

2006/0057790 A1* 3/2006 Clarke ............. H01L 29/66462
438/172
2011/0156004 A1* 6/2011 Radosavljevic ....... B82Y 10/00
257/24
(Continued)

OTHER PUBLICATIONS

Kizir, Seda, et al. "Substrate Impact on the Low-Temperature Growth of GaN Thin Films by Plasma-Assisted Atomic Layer Deposition." Journal of Vacuum Science & Technology A: Vacuum, Surfaces, and Films, vol. 34, No. 4, 2016, p. 041511., doi:10.1116/1.4953463.*

(Continued)

*Primary Examiner* — Joseph Schoenholtz
(74) *Attorney, Agent, or Firm* — McDermott Will & Emery LLP

(57) ABSTRACT

In a method of manufacturing a high-electron mobility transistor (HEMT), a first Group III-V semiconductor layer is formed on a substrate. The first Group III-V semiconductor layer is patterned to form a fin and a recessed surface. A second Group III-V semiconductor layer is formed to cover a top surface and all side surfaces of the fin and the recessed surface. The second Group III-V semiconductor layer is formed by a plasma-enhanced atomic layer deposition, in which a plasma treatment is performed on every time an as-deposited mono-layer is formed.

19 Claims, 19 Drawing Sheets

(51) Int. Cl.
- C30B 29/40 (2006.01)
- C30B 25/02 (2006.01)
- C30B 25/18 (2006.01)
- H01L 21/02 (2006.01)
- H01L 29/778 (2006.01)
- H01L 29/205 (2006.01)
- C23C 16/44 (2006.01)
- H01L 29/20 (2006.01)
- C23C 16/30 (2006.01)
- H01L 29/78 (2006.01)

(52) U.S. Cl.
CPC .. *C23C 16/45536* (2013.01); *C23C 16/45542* (2013.01); *C30B 25/02* (2013.01); *C30B 25/18* (2013.01); *C30B 29/406* (2013.01); *H01L 21/0254* (2013.01); *H01L 21/0262* (2013.01); *H01L 21/02634* (2013.01); *H01L 29/2003* (2013.01); *H01L 29/205* (2013.01); *H01L 29/66795* (2013.01); *H01L 29/7787* (2013.01); *H01L 29/7851* (2013.01)

(56) References Cited

U.S. PATENT DOCUMENTS

| | | | |
|---|---|---|---|
| 2013/0277683 A1* | 10/2013 | Then | H01L 29/66462 257/76 |
| 2016/0365341 A1* | 12/2016 | Then | H01L 27/0629 |
| 2017/0186598 A1* | 6/2017 | Goel | H01L 29/785 |
| 2017/0256394 A1* | 9/2017 | Hawryluk | H01L 21/268 |

OTHER PUBLICATIONS

Luc, Quang Ho, et al., "Effects of In-Situ Plasma-Enhanced Atomic Layer Deposition Treatment on the Performance of HfO2/In0.53Ga0. 47As Metal-Oxide-Semiconductor Field-Effect Transistors", IEEE Electron Device Letters vol. 37, No. 8, Aug. 2016; 4 pages.

* cited by examiner

| | GaN | AlN/GaN without in-situ Ar plasma treatment | AlN/GaN with in-situ Ar plasma treatment |
|---|---|---|---|
| Sheet concentration ($cm^{-2}$) | $10^8 \sim 10^{10}$ | $1.6 \times 10^{12}$ | $1.4 \times 10^{13}$ |
| Mobility ($cm^2/V \cdot s$) | 9.8 | 53.3 | 250.3 |
| Resistivity ($\Omega\text{-cm}$) | $10^3 \sim 10^4$ | 11.9 | 0.87 |

FIG. 3

HEMTS WITH AN ALXGA1-XN BARRIER LAYER GROWN BY PLASMA ENHANCED ATOMIC LAYER DEPOSITION

RELATED APPLICATIONS

This application claims the priority of U.S. Provisional Application No. 62/410,167 filed on Oct. 19, 2016, the entire contents of which application are incorporated herein by reference.

TECHNICAL FIELD

This disclosure relates to Group III-V (III-V) semiconductor layers, III-V semiconductor devices, such as high electron mobility transistors (HEMTs), and methods of manufacturing the same.

BACKGROUND

High electron mobility transistors (HEMTs) based on a hetero-structure of two Group III-V compound semiconductors exhibit excellent two dimensional electron gas (2DEG) characteristics due to its large band offset and polarization induced charge at the hetero-interface, resulting in a high sheet concentration and a high mobility. If the Group III-V semiconductor layers are formed by MOCVD (Metal-Organic Chemical Vapor Deposition), high growth temperatures are generally required. Besides, the step coverage of the thin films prepared by MOCVD is poor when deposited on a structure with a high aspect ratio, such as a fin structure. Accordingly, it is generally difficult to grow Group III-V compound semiconductor hetero-structures by MOCVD on side walls of a nano-scale fin. The poor interface quality at the sidewalls may induce strong electron scattering and reduce the device mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 shows a comparison of electronic properties of AlN layers prepared by different methods.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." The order of the following operations can be changed. One or more additional operations may be performed during or after the following operations, and one or more of the following operations can be removed.

In the present disclosure, a heterostructure formed by Group III-V semiconductor materials is applied to HEMTs. More specifically, an $Al_xGa_{1-x}N/GaN$ ($0<x<1$) heterostructure is applied in HEMTs. In an embodiment of this disclosure, an $Al_xGa_{1-x}N$ barrier layer is grown by plasma enhanced atomic layer deposition (PE-ALD) with in-situ Ar plasma treatment on a GaN layer. The $Al_xGa_{1-x}N$ barrier layer formed by the PE-ALD according to the embodiment exhibits a good crystalline quality and the 2DEG (two-dimensional electron gas) characteristics.

Figure 1:
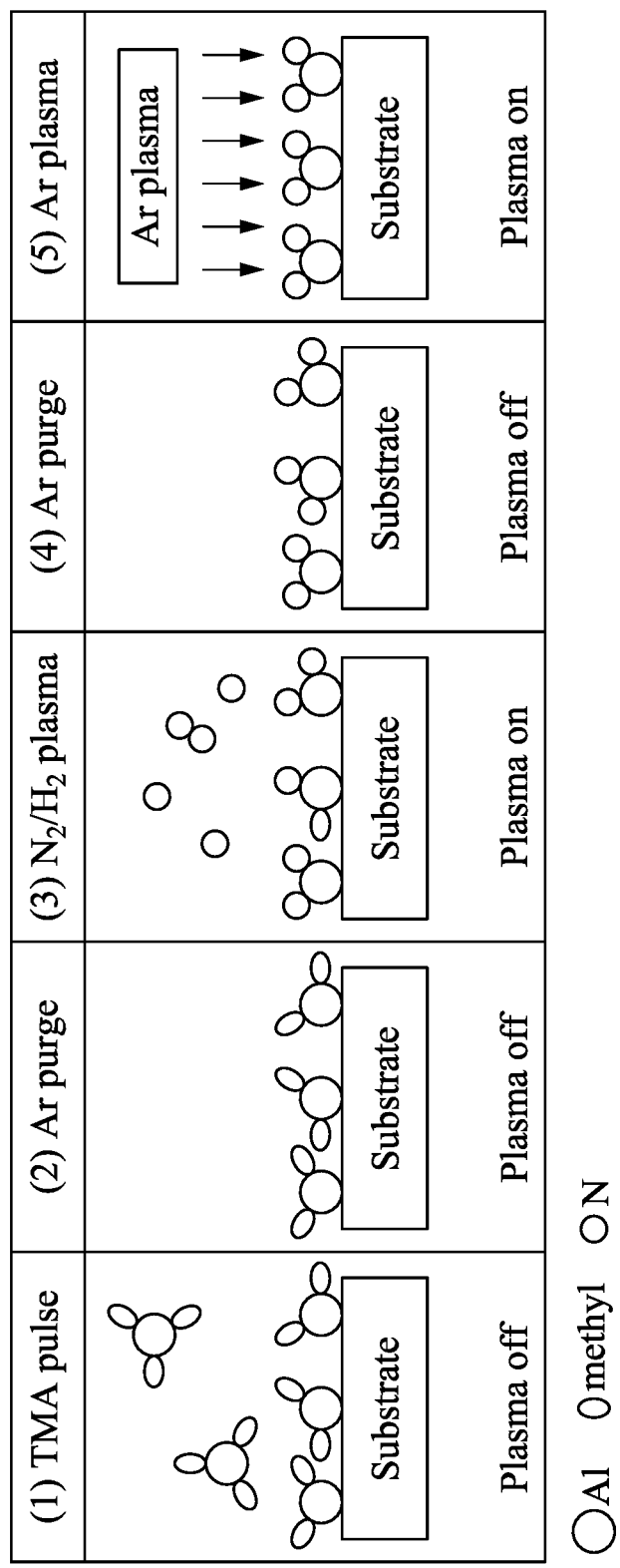
FIG. 1 shows a flow of a plasma enhanced atomic layer deposition according to an embodiment of the present disclosure.

FIG. 1 shows an exemplary flow of a plasma enhanced atomic layer deposition according to an embodiment of the present disclosure. In one embodiment, as operation (1) a first source material is provided over a substrate. In some embodiments, the substrate includes a GaN layer epitaxially formed on a base substrate. The base substrate may be GaN, sapphire or Si. The first source material is a source material (precursor) for a Group-III element, such as Al, Ga and In. For example, the first source material is at least one of trimethylaluminium (TMA or TMAl), triethylaluminium (TEA or TEAl), trimethylgallium (TMG or TMGa), triethylgallium (TEG or TEGa), trimethylindium (TMI or TMIn), triethylindium (TEI or TEIn), di-isopropylmethylindium (DIPMeIn), and ethyldimethylindium (EDMIn). In one embodiment, TMA is used. In some embodiments, the pressure in the chamber is maintained at about 0.1 to about 1.0 Torr and a partial pressure of TMA is about 0.01 to about 0.05 Torr per pulse.

After operation (1), the substrate is purged with a non-reactive gas, as operation (2). The non-reactive gas may include He, Ar, Ne and/or $N_2$. In one embodiment, Ar is used as the purge gas. As shown in FIG. 1, a mono layer of aluminum precursor (TMA) is formed on the GaN substrate. In operations (1) and (2), no plasma assistance for a film deposition is utilized.

After operation (2), as operation (3), a second source material is provided over the substrate, thereby forming a first as-deposited mono-layer of a first semiconductor material. The second source material is a source material (precursor) for a Group-V element, such as N, As and Sb. In one embodiment, a source gas for atomic nitrogen is used. For example, the second source material is at least one of $N_2$, a mixture of $N_2$ and $H_2$ and $NH_3$. The second source gas is supplied as plasma over the substrate. In some embodiments, the pressure in the chamber is maintained at about 0.5 Torr to about 1.5 Torr, and the gas flow rate of $N_2$ and $H_2$ are both about 10 sccm to about 100 sccm.

After operation (3), the substrate is purged with a non-reactive gas, as operation (4). The non-reactive gas may include He, Ar, Ne and/or $N_2$. In one embodiment, Ar is used as the purge gas. The purge gas in operation (4) may be the same as or different from the purge gas of operation (2). As shown in FIG. 1, a mono layer of AlN as the first as-deposited mono-layer is formed on the GaN substrate. In operation (4), no plasma assistance for a film deposition is utilized.

After operation (4), as operation (5), the first as-deposited mono-layer is treated with plasma, thereby forming a first mono-layer of the first semiconductor material, an AlN mono-layer. In some embodiments, a source gas of the plasma for treating the first mono-layer includes at least one of He, Ar, Ne and $N_2$. In one embodiment, Ar plasma is utilized. The in-situ plasma treatment provides crystallization energy for the AlN layer. In some embodiments, the pressure of the chamber is maintained at about 0.1 Torr to about 1.0 Torr, and Ar or He flow rate is about 50 sccm to about 150 sccm. In some embodiments, the plasma treatment is performed for about 30 second to about 60 second.

The operations (1)-(5) may be repeated to obtain a desired film thickness. For example, by repeating the operations (1)-(5) five times, an AlN layer having a thickness of about 0.5 nm can be obtained.

When a TMG gas is utilized as the first source material gas (precursor) and a nitrogen containing gas is utilized as the second source material gas, a GaN mono-layer is formed.

In some embodiments, the PE-ALD process including operations (1)-(5) is carried out at a substrate temperature in a range from about 200° C. to about 800° C. In other embodiments, the substrate temperature is in a range from about 250° C. to about 350° C.

Figure 2A:
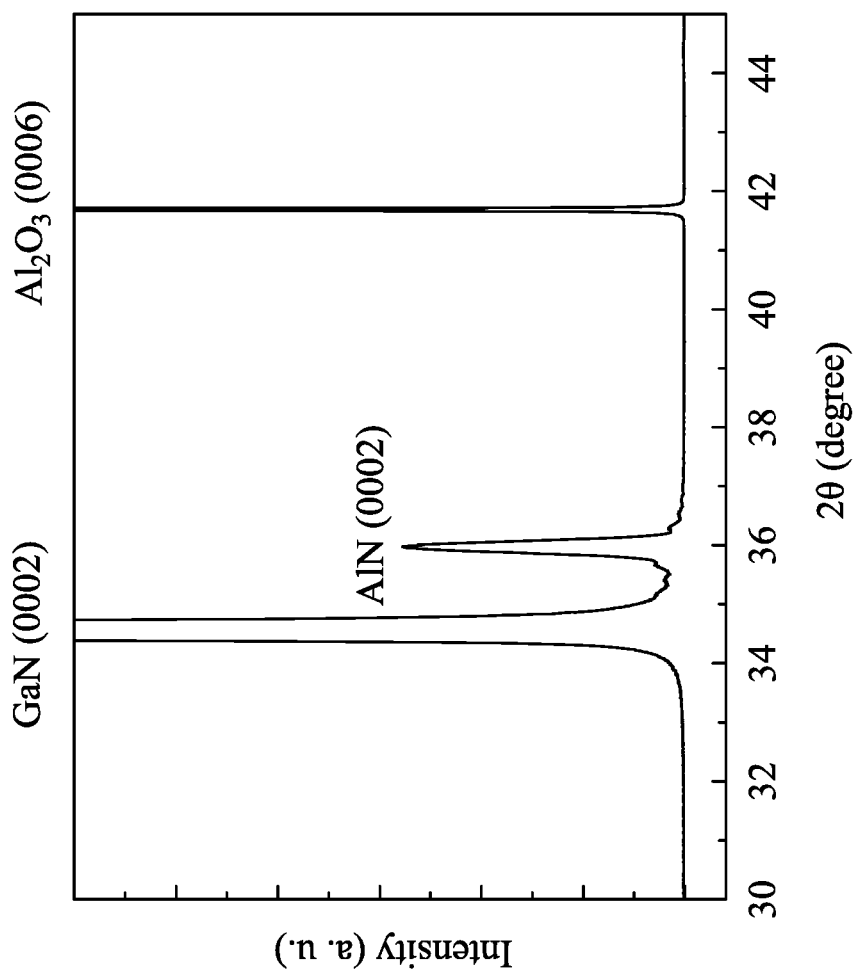
FIGS. 2A and 2B show XRD (X-ray diffraction) results of an AlN layer formed on a GaN layer manufactured according to an embodiment of the present disclosure.
Figure 2B:
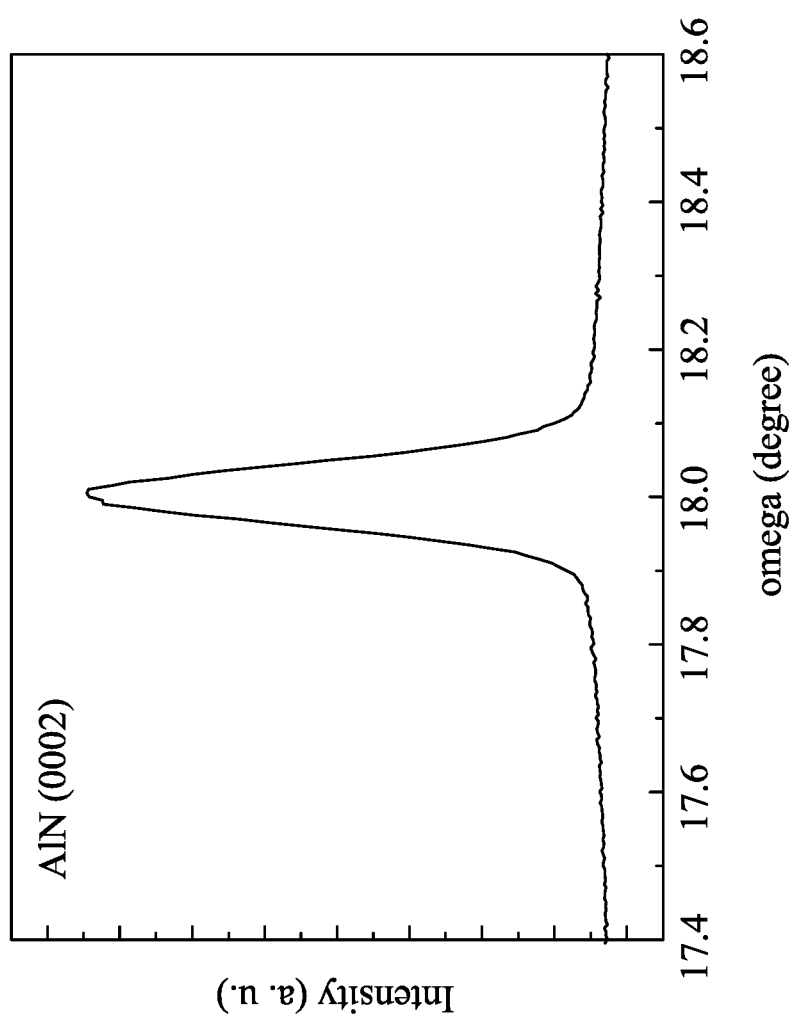

FIGS. 2A and 2B show XRD (X-ray Diffraction) results of an AlN layer formed on a GaN layer manufactured by using the PE-ALD. As shown in FIG. 2A, XRD θ-2θ scan confirms that the AlN layer on the GaN epitaxial layer prepared by the PE-ALD with in-situ plasma treatment is crystallized with a hexagonal structure. Further, as shown in FIG. 2B, the XRD omega scan shows that the full width at half maximum (FWHM) of the AlN barrier layer achieved 360 arcsec (=0.1 degree), indicating a high-quality single crystal AlN layer.

FIG. 3 shows a comparison of electronic properties of AlN layers prepared by different methods. As shown in FIG. 3, the in-situ plasma treatment (operation (5)) can improve electronic properties of an AlN/GaN heterojunction. While the AlN/GaN heterojunction without the in-situ Ar plasma treatment during the deposition of AlN exhibited sheet concentration $n_s$ of only $1.6 \times 10^{12}$ cm$^{-2}$, the $n_s$ unexpectedly increased by one order of magnitude to $1.4 \times 10^{13}$ cm$^{-2}$ in the AlN/GaN heterojunction with the in-situ Ar plasma treatment during the deposition of AlN. The mobility also unexpectedly increased from 53.3 to 214.1 $cm^2V^{-1}\ s^{-1}$ for the in situ Ar plasma treatment on the AlN layer. The remarkable enhancement of the AlN crystallinity by the in-situ Ar plasma treatment is responsible for the significant increase of the $n_s$ and mobility. The significant increase of the sheet electron concentration and mobility could be attributed to the onset of the 2DEG near the AlN/GaN heterojunction prepared with the in-situ Ar plasma treatment. Similar improvements can be obtained for in-situ He plasma treatment. The AlN layer grown by PE-ALD with in-situ plasma treatment on the GaN layer exhibits improved 2DEG characteristics. In some embodiments, the thickness of AlN is about 8 nm in FIGS. 2A and 2B, which is equal to 80 ALD cycles.

Figure 4A:
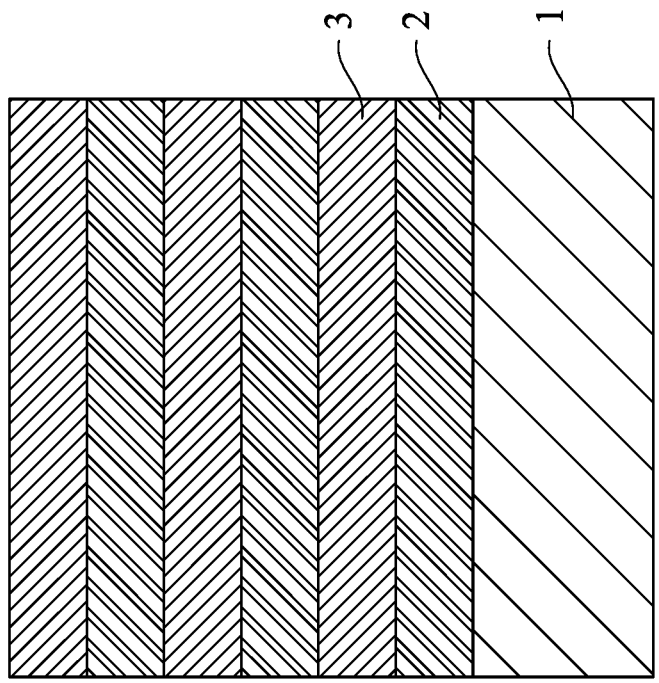
FIGS. 4A and 4B show stacked structures of AlN and GaN according to embodiments of the present disclosure.
Figure 4B:
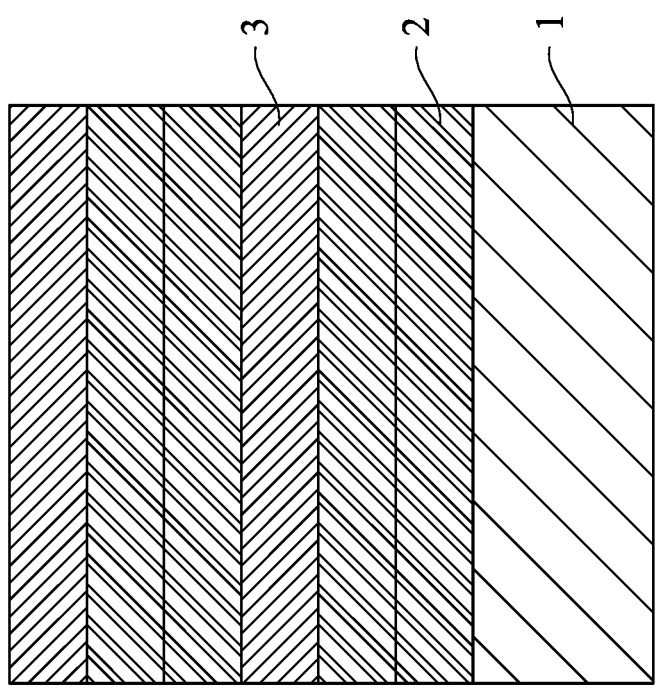

FIGS. 4A and 4B show exemplary stacked structures of AlN and GaN according to embodiments of the present disclosure. By changing the first source material between TMA and TMG, a stacked structure of AlN layers and GaN layers can be formed.

In FIG. 4A, two AlN mono-layers 2 are formed on a substrate 1 by repeating operations (1)-(5) using TMA. Subsequently, one GaN mono-layer 3 is formed on the AlN layer 2 by operations (1)-(5) using TMG. By repeating formation of two AlN mono-layers and one GaN mono-layer, a stacked $Al_xGa_{1-x}N$ layer, where x is ⅔, can be formed.

In FIG. 4B, one AlN mono-layer 2 is formed on the substrate 1 by operations (1)-(5) using TMA, and subsequently, one GaN mono-layer 3 is formed on the AlN layer 2 by operations (1)-(5) using TMG. By repeating formation of one AlN mono-layer and one GaN mono-layer, a stacked $Al_xGa_{1-x}N$ layer, where x is ½, can be formed.

The numbers of AlN mono-layers and the numbers of GaN mono-layers are not limited to the cases of FIGS. 4A and 4B. A total number of AlN mono-layer (repetition number of operations (1)-(5) with TMA) may be equal to or different from a total number of the GaN mono-layer (repetition number of operations (1)-(5) with TMG). When the total number of AlN mono-layers is M1 and the total number of GaN mono-layers is M2, the stacked $Al_xGa_{1-x}N$ layer, where x is M1/(M1+M2), can be formed. In other words, by controlling the numbers of AlN mono-layers and GaN mono-layers, it is possible to control composition of an AlGaN layer.

FIGS. 5-11 show exemplary cross sectional views of various stages for manufacturing a III-V semiconductor FET device according to an embodiment of the present disclosure. The order of the following operations can be changed. One or more additional operations may be performed during or after the following operations, and one or more of the following operations can be removed. Materials, configurations, operations and structures the same as or similar to the foregoing embodiments may be applied to the following embodiments, and the detailed explanation may be omitted.

Figure 5:
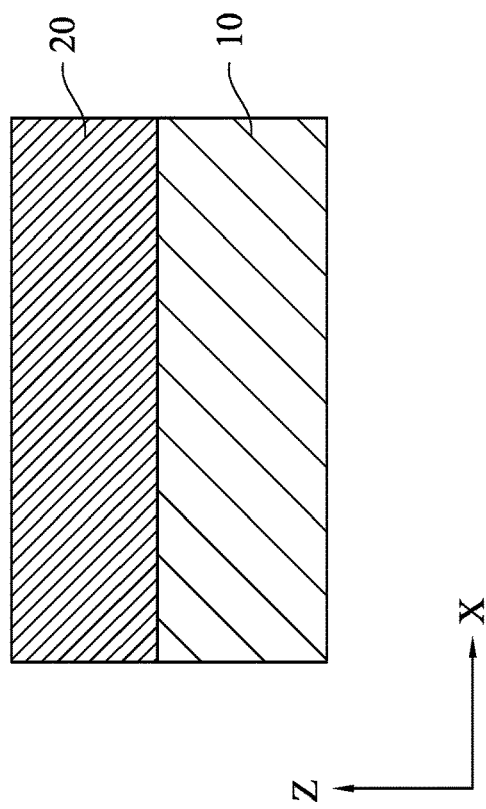
FIG. 5 shows a cross sectional view of one of the various stages for manufacturing a III-V semiconductor FET device according to an embodiment of the present disclosure.

In FIG. 5, a first III-V semiconductor layer 20 is epitaxially formed on a substrate 10. The substrate 10 is one of a Group III-V semiconductor, sapphire and silicon. In one embodiment, the substrate 10 is a sapphire substrate. The first III-V semiconductor layer 20 can be formed by using the PE-ALD with the in-situ plasma treatment as set forth above.

Figure 6:
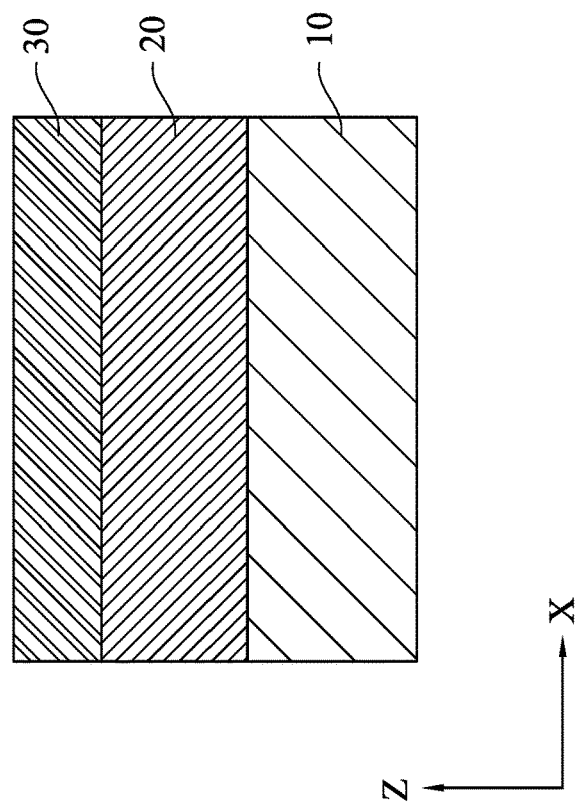
FIG. 6 shows a cross sectional view of one of the various stages for manufacturing a III-V semiconductor FET device according to an embodiment of the present disclosure.

Then, as shown in FIG. 6, a second III-V semiconductor layer 30 is formed on the first III-V semiconductor layer 20 by using metal organic chemical vapor deposition (MOCVD) in some embodiments.

In some embodiments, the second III-V semiconductor layer 30 has a larger band gap energy than the first III-V semiconductor layer 20. In certain embodiments, the first III-V semiconductor layer is made of GaN, and the second III-V semiconductor layer is made of $Al_xGa_{(1-x)}N$, where 0<x<1. The $Al_xGa_{(1-x)}N$ layer includes M1 mono-layers of AlN and M2 mono-layers of GaN and x=M1/(M1+M2).

The thickness of the second III-V semiconductor layer 30 is in a range from about 1 nm to about 100 nm in some embodiments.

Figure 7:
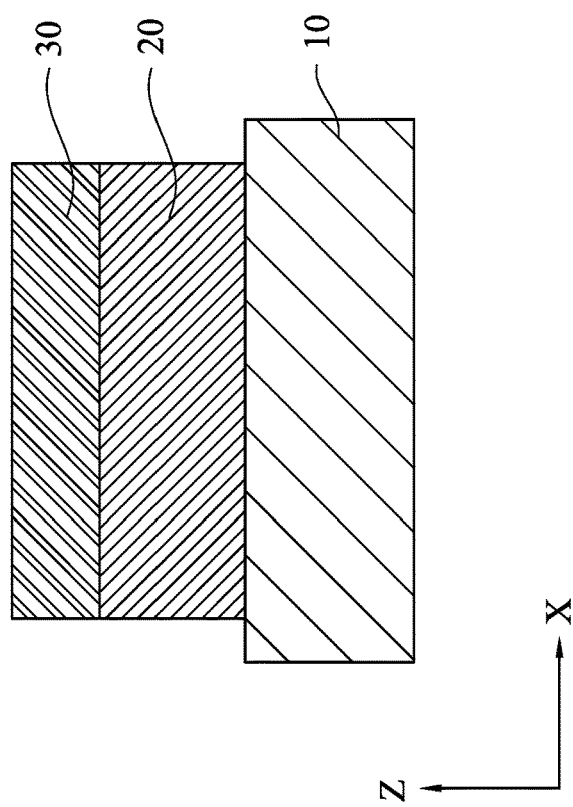
FIG. 7 shows a cross sectional view of one of the various stages for manufacturing a III-V semiconductor FET device according to an embodiment of the present disclosure.

Then, as shown in FIG. 7, the first and second III-V semiconductor layers 20, 30 are patterned to be isolated, by using suitable patenting operations. In some embodiments, the first and second III-V semiconductor layers 20, 30 are patterned into a fin structure.

In a certain embodiment, before forming the second III-V semiconductor layer 30, the first III-V semiconductor layer 20 is subjected to the isolation patterning to be formed into a fin structure, and then the second III-V semiconductor layer 30 is formed by the PE-ALD. In such a case, the top and side surfaces of the fin structure of the first III-V semiconductor layer 20 are covered by the second III-V semiconductor layer 30.

Figure 8:
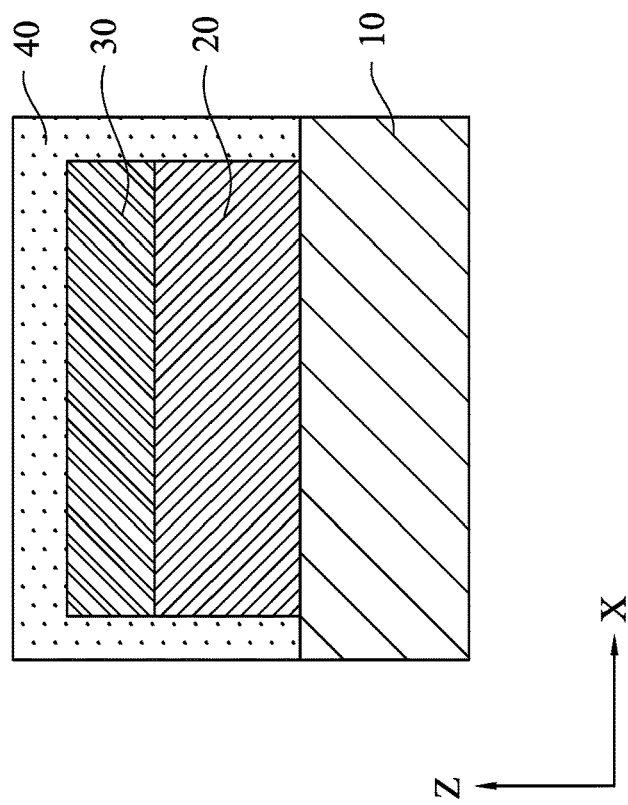
FIG. 8 shows a cross sectional view of one of the various stages for manufacturing a III-V semiconductor FET device according to an embodiment of the present disclosure.

After the isolation patterning, a dielectric layer 40 is formed to cover a top surface of the second III-V semiconductor layer 30 and side surfaces of the first and second III-V semiconductor layers 20, 30, as shown in FIG. 8. The dielectric layer 40 includes one or more layers of $Al_2O_3$, $SiO_2$, SiN, $HfO_2$, $ZrO_2$, $Ta_2O_5$ and $Ga_2O_3$. The dielectric layer 40 may be formed by chemical vapor deposition (CVD), physical vapor deposition (PVD) and/or ALD. The thickness of the dielectric layer 40 is in a range from about 1 nm to about 50 nm in some embodiments.

Figure 10:
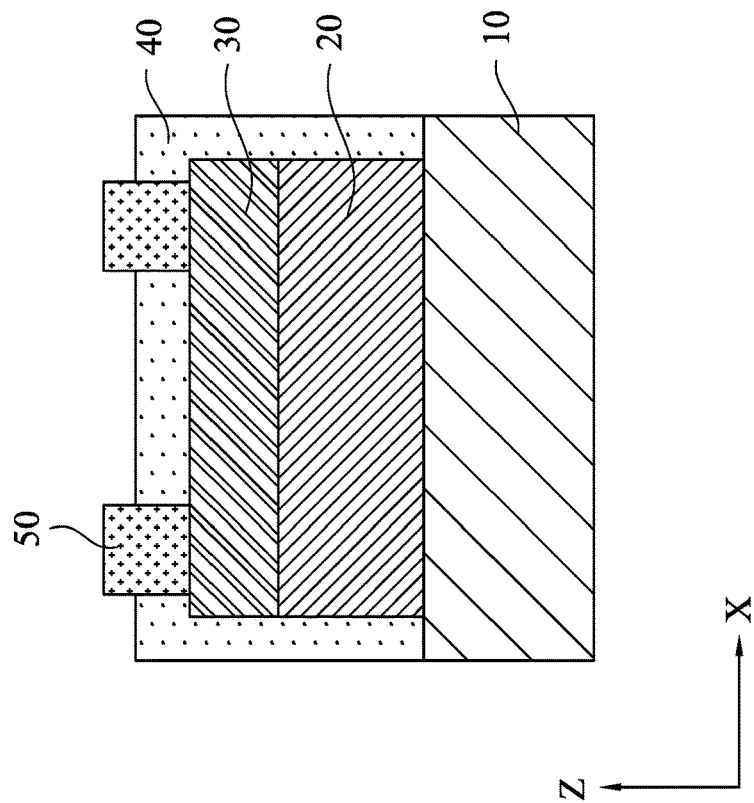
FIG. 10 shows a cross sectional view of one of the various stages for manufacturing a III-V semiconductor FET device according to an embodiment of the present disclosure.
Figure 9:
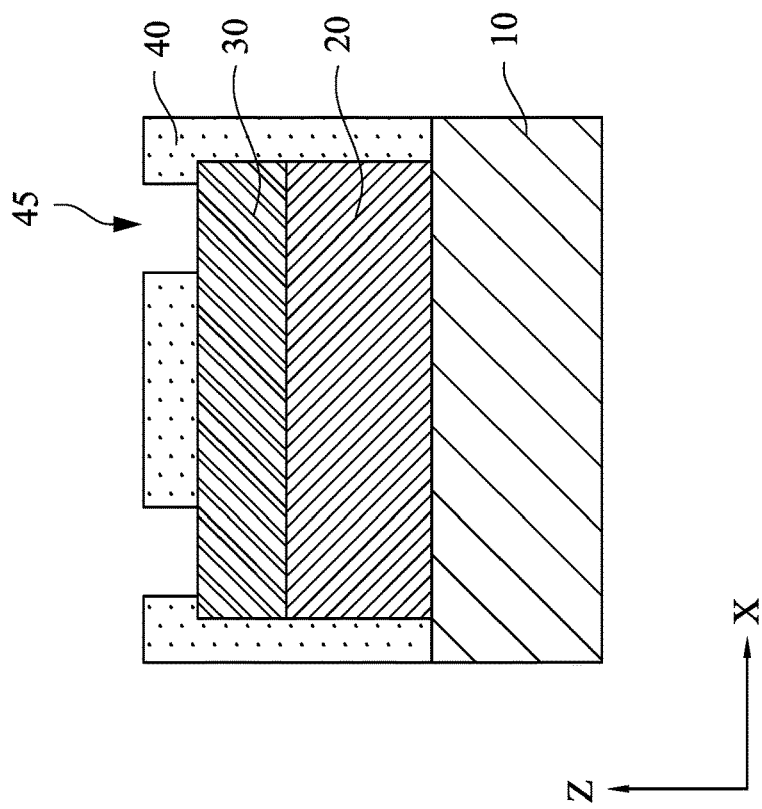
FIG. 9 shows a cross sectional view of one of the various stages for manufacturing a III-V semiconductor FET device according to an embodiment of the present disclosure.

After the dielectric layer 40 is formed, source/drain openings 45 are formed in the dielectric layer 40, as shown in FIG. 9, and then, a conductive material is formed in the source/drain openings 45, thereby forming source/drain electrodes 50, as shown in FIG. 10. In this embodiment, the source/drain openings 45 stop at the surface of the second III-V semiconductor layer 30. In other embodiments, the source/drain openings 45 penetrate into the second III-V semiconductor layer 30 but do not reach the first III-V semiconductor layer 20. The conductive material for the source/drain electrode 50 is at least one of Ti, Al, Ni, and Au, and alloys thereof.

Figure 11:
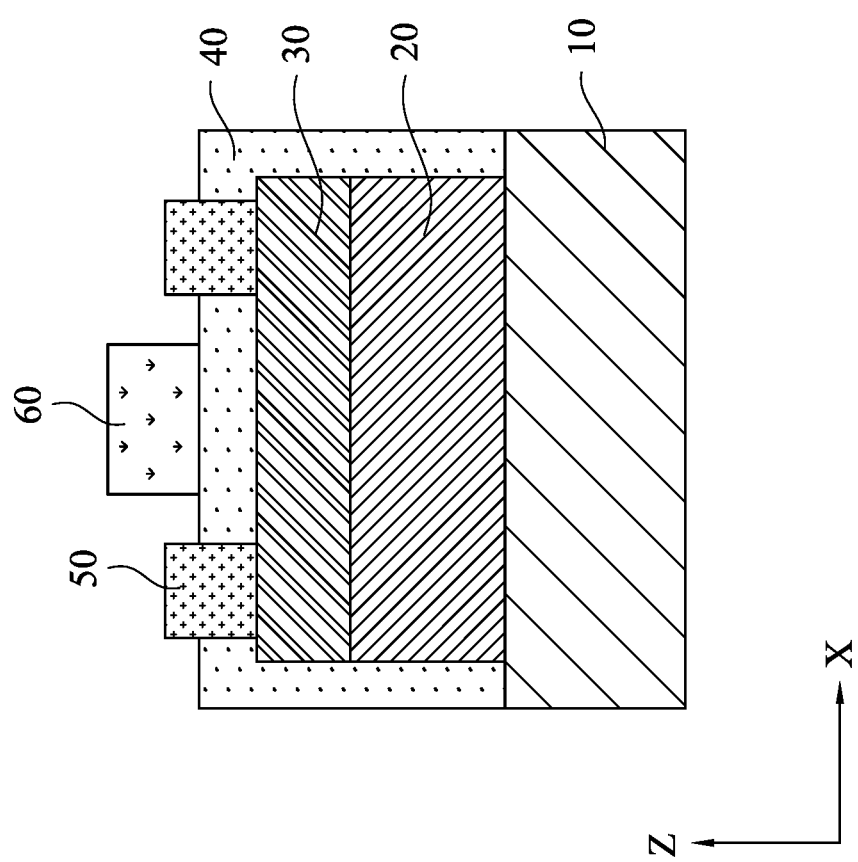
FIG. 11 shows a cross sectional view of one of the various stages for manufacturing a III-V semiconductor FET device according to an embodiment of the present disclosure.

Subsequently, a gate electrode 60 is formed on the dielectric layer 40 as shown in FIG. 11. The gate electrode 60 is at least one of Cr, Ni, Au, Ti, Pt, TiN, TaN and an alloy of Cr/Au and Ni/Au.

Figure 13:
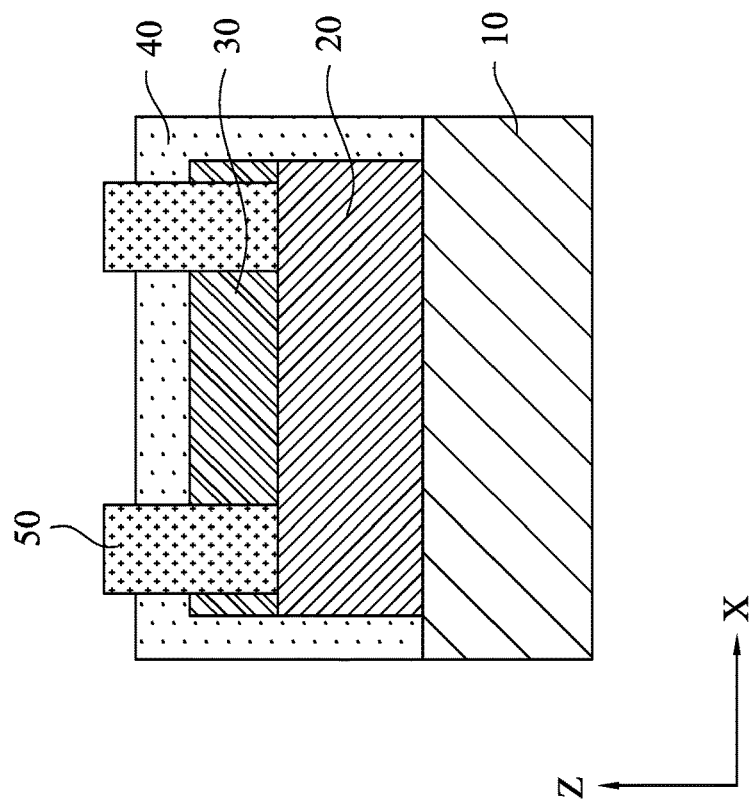
FIG. 13 shows a cross sectional view of one of the various stages for manufacturing a III-V semiconductor FET device according to an embodiment of the present disclosure.
Figure 12:
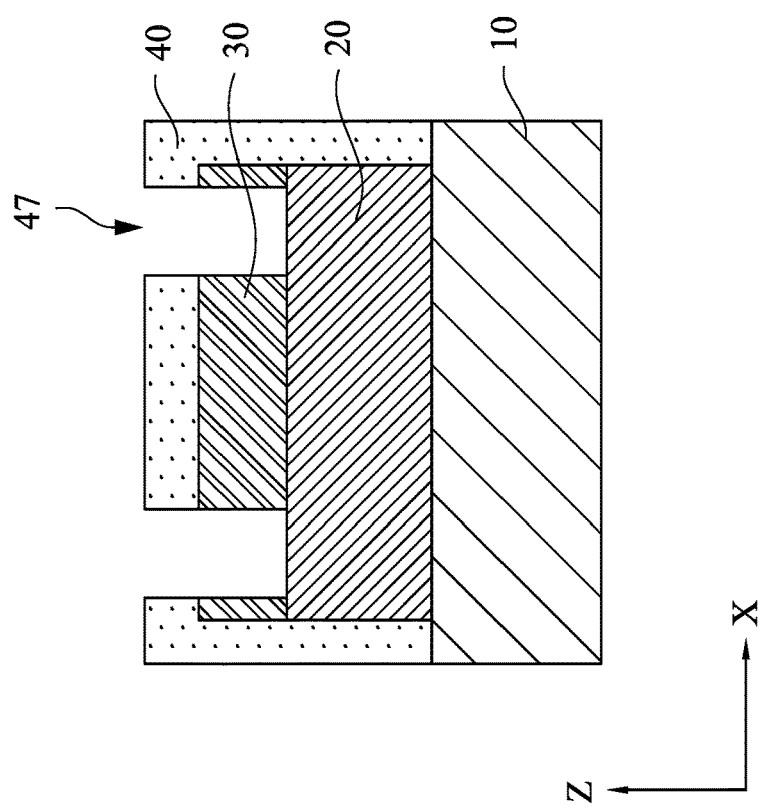
FIG. 12 shows a cross sectional view of one of the various stages for manufacturing a III-V semiconductor FET device according to an embodiment of the present disclosure.
Figure 14:
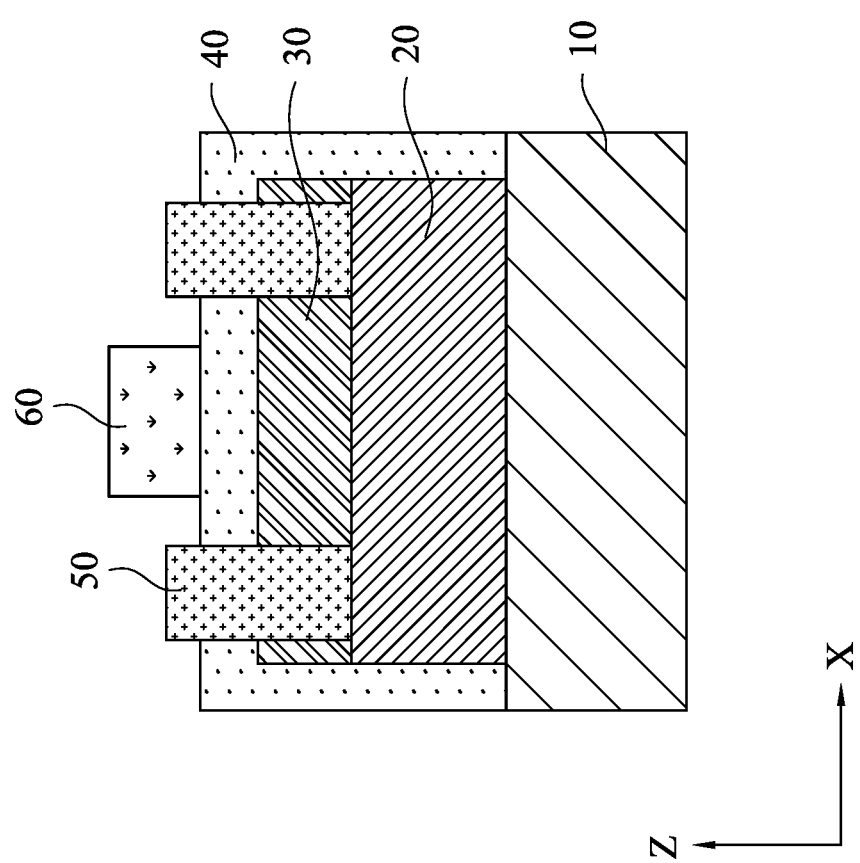
FIG. 14 shows a cross sectional view of one of the various stages for manufacturing a III-V semiconductor FET device according to an embodiment of the present disclosure.

FIGS. 12-14 show exemplary cross sectional views of various stages for manufacturing a III-V semiconductor FET device according to an embodiment of the present disclosure. Materials, configurations, operations and structures same as or similar to the foregoing embodiments may be applied to the following embodiments, and the detailed explanation may be omitted.

In this embodiment, the source/drain openings 47 are formed to pass through the second III-V semiconductor layer 30 and to reach the first III-V semiconductor layer 20, as shown in FIG. 12. Then, the conductive material is filled in the source/drain openings 47 to be in contact with the first III-V semiconductor layer 20, as shown in FIG. 13. After the source/drain electrodes 50 are formed, a gate electrode 60 is formed as shown in FIG. 14.

FIGS. 15-20 show exemplary cross sectional views of various stages for manufacturing a III-V semiconductor FET device according to another embodiment of the present disclosure. The order of the following operations can be changed. One or more additional operations may be performed during or after the following operations, and one or more of the following operations can be removed. Materials, configurations, operations and structures same as or similar to the foregoing embodiments may be applied to the following embodiments, and the detailed explanation may be omitted.

Figure 15:
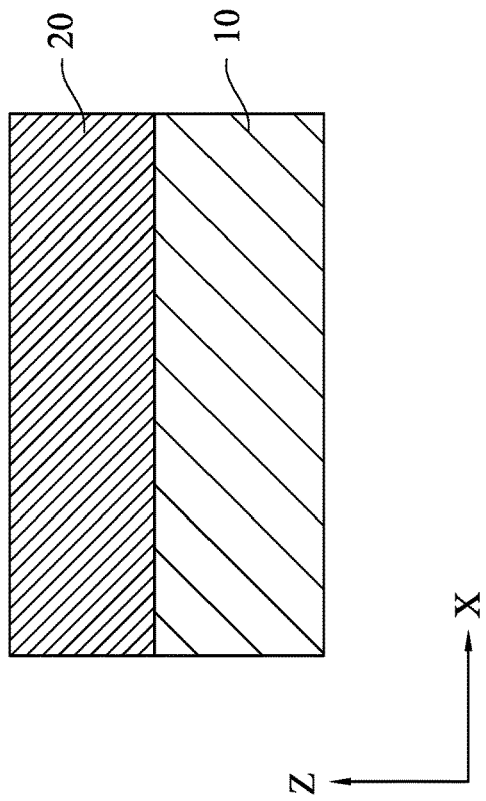
FIG. 15 shows a cross sectional view of one of the various stages for manufacturing a III-V semiconductor FET device according to an embodiment of the present disclosure.
Figure 16:
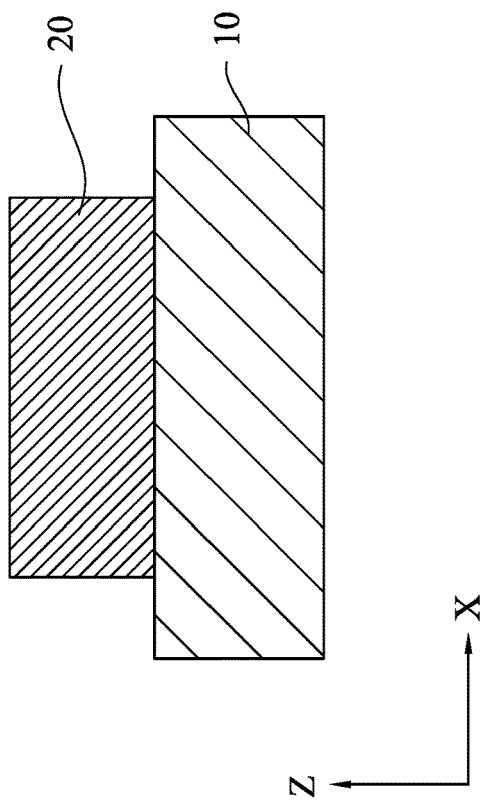
FIG. 16 shows a cross sectional view of one of the various stages for manufacturing a III-V semiconductor FET device according to an embodiment of the present disclosure.
Figure 17:
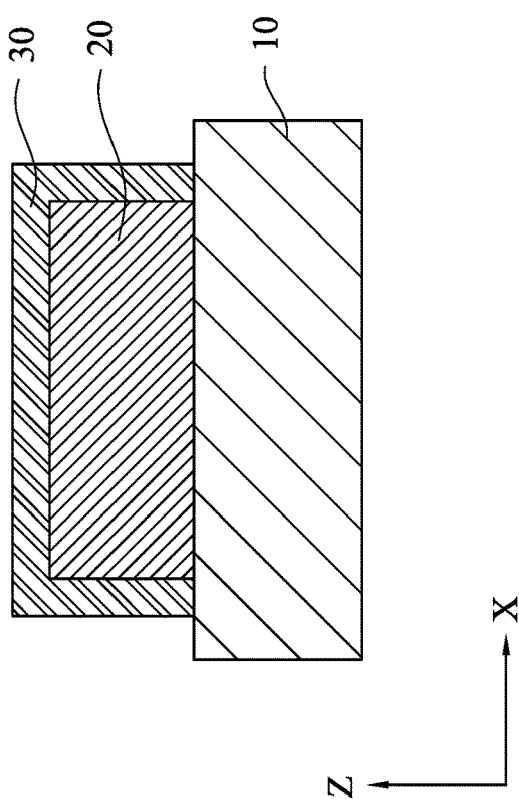
FIG. 17 shows a cross sectional view of one of the various stages for manufacturing a III-V semiconductor FET device according to an embodiment of the present disclosure.

After the first III-V semiconductor layer 20 is epitaxially formed on a substrate 10 as shown in FIG. 15, the first III-V semiconductor layer 20 is patterned into a fin structure as shown in FIG. 16. The fin structure 20 extends in the X direction. Then, a second III-V semiconductor layer 30 is formed on the fin structure of the first III-V semiconductor layer 20 by using the PE-ALD with the in-situ plasma treatment, as shown in FIG. 17. Although FIG. 17 shows one cross section of the first and second III-V semiconductor layers 20 and 30, the second III-V semiconductor layer 30 covers all top and side surfaces of the fin structure of the first III-V semiconductor layer 20. The thickness of the second III-V semiconductor layer 30 is in a range from about 1 nm to about 100 nm in some embodiments.

Figure 18:
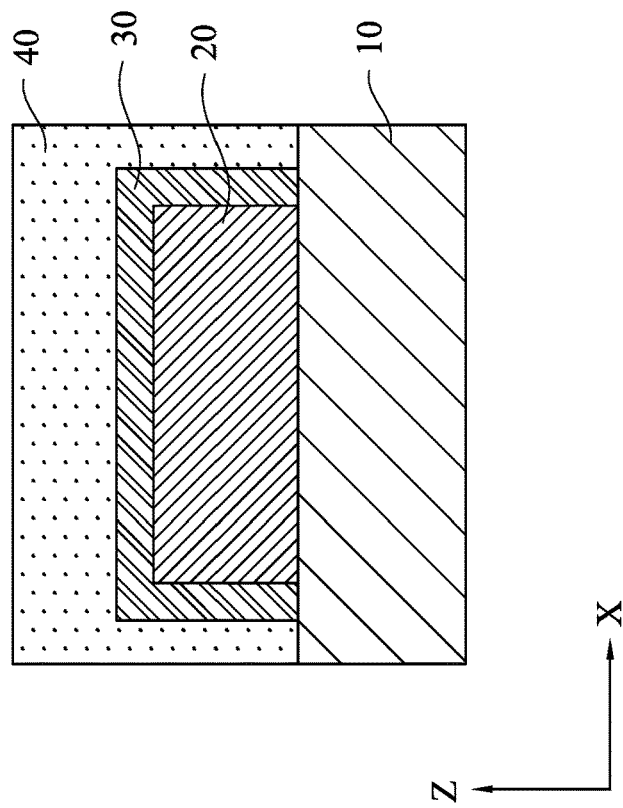
FIG. 18 shows a cross sectional view of one of the various stages for manufacturing a III-V semiconductor FET device according to an embodiment of the present disclosure.

Subsequently, similar to FIG. 8, a dielectric layer 40 is formed on the second III-V semiconductor layer 30 as shown in FIG. 18. The thickness of the dielectric layer 40 is in a range from about 2 nm to about 20 nm in some embodiments.

Figure 19:
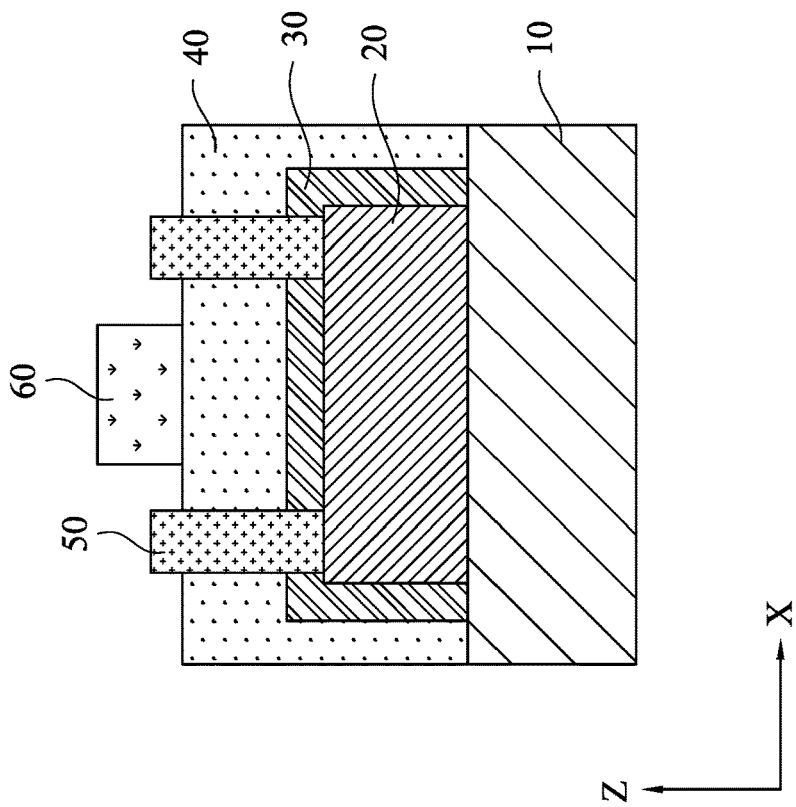
FIG. 19 shows a cross sectional view of one of the various stages for manufacturing a III-V semiconductor FET device according to an embodiment of the present disclosure.
Figure 20:
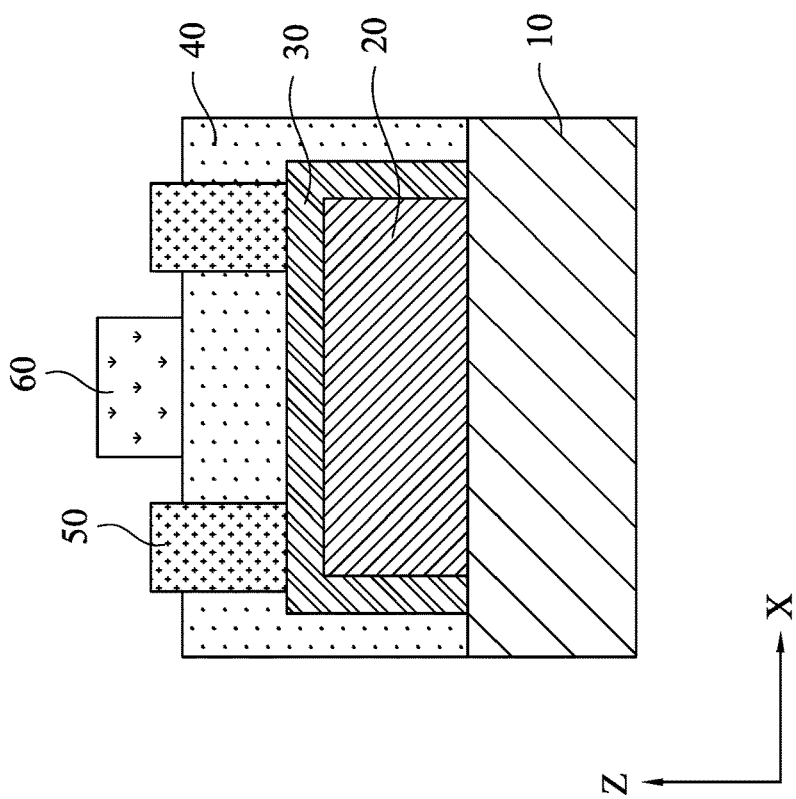
FIG. 20 shows a cross sectional view of one of the various stages for manufacturing a III-V semiconductor FET device according to an embodiment of the present disclosure.

FIG. 19 shows an FET formed by similar operations to form the FET of FIG. 11, and FIG. 20 shows an FET formed by similar operations to form the FET of FIG. 14. In FIGS. 19 and 20, the gate electrode 60 extends in the Y direction and the dielectric layer 40 is not in direct contact with the first III-V semiconductor layer 20.

FIGS. 21-26 show exemplary cross sectional views of various stages for manufacturing a III-V semiconductor FET device according to an embodiment of the present disclosure. The order of the following operations can be changed. One or more additional operations may be performed during or after the following operations, and one or more of the following operations can be removed. Materials, configurations, operations and structures same as or similar to the foregoing embodiments may be applied to the following embodiments, and the detailed explanation may be omitted.

A first III-V semiconductor layer 115 is epitaxially formed on a substrate 110. The substrate 110 is one of a Group III-V semiconductor, sapphire and silicon. In one embodiment, the substrate 110 is a sapphire substrate. The first III-V semiconductor layer 115 can be formed by using MOCVD.

Figure 21:
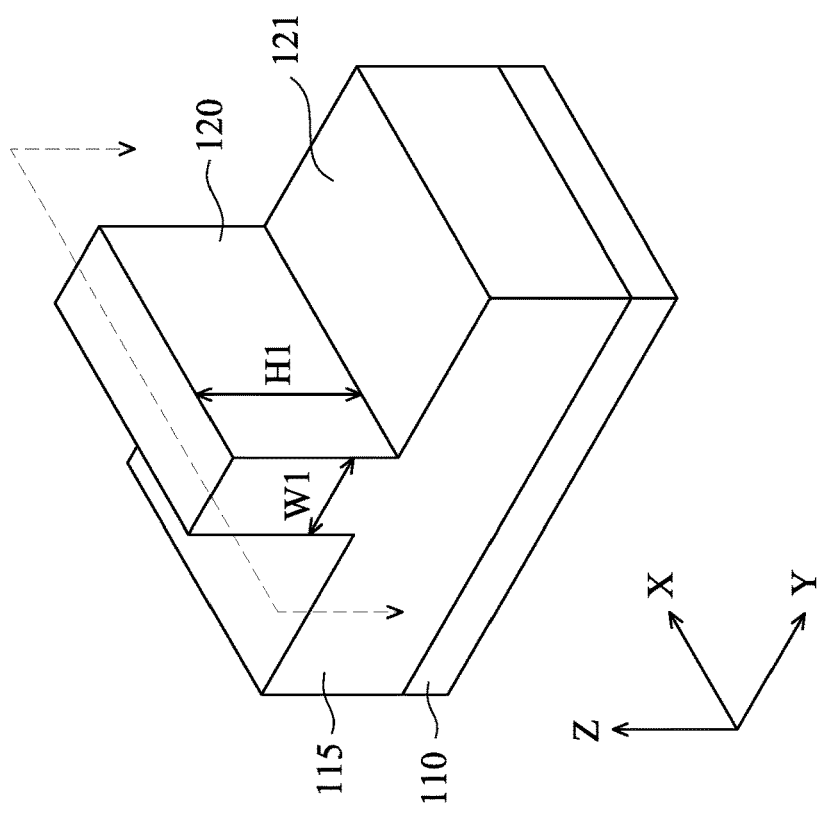
FIG. 21 shows a cross sectional view of one of the various stages for manufacturing a III-V semiconductor FET device according to an embodiment of the present disclosure.

The first III-V semiconductor layer 115 is pattered to form a fin 120 and a recessed surface 121 as shown in FIG. 21. The width W1 of the fin 120 is in a range from about 5 nm to about 100 nm in some embodiments. The height H1 of the fin 120 from the recessed surface 121 is in a range from about 5 nm to about 500 nm in some embodiments.

Figure 22:
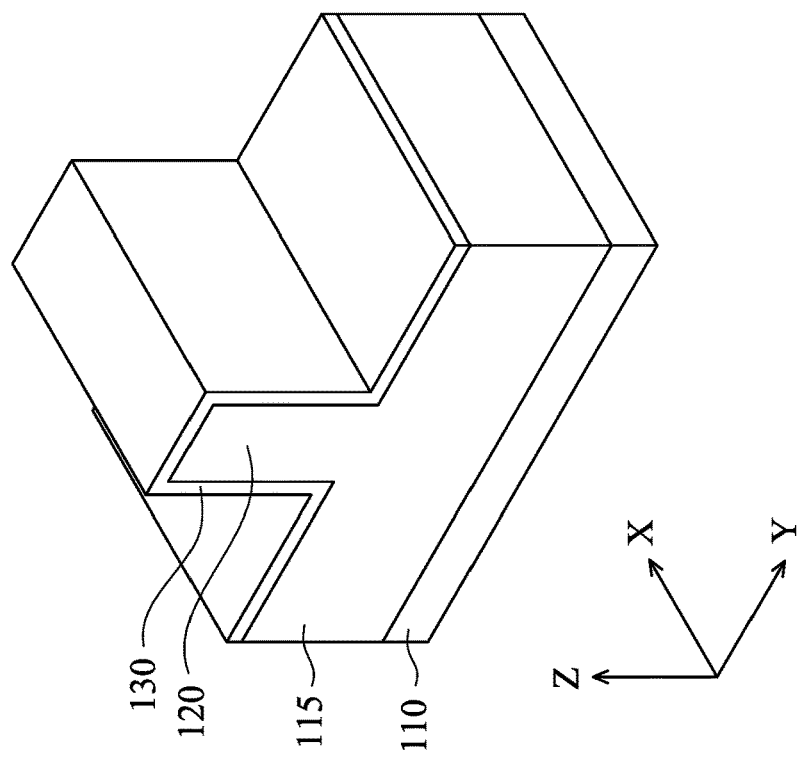
FIG. 22 shows a cross sectional view of one of the various stages for manufacturing a III-V semiconductor FET device according to an embodiment of the present disclosure.

After the fin 120 is formed, a second III-V semiconductor layer 130 is epitaxially formed to cover a top surface and side surfaces of the fin 120 and the recessed surface 121, as shown in FIG. 22. Although FIG. 22 shows a cross section of the fin 120, the second III-V semiconductor layer 130 can cover the all side surfaces of the fin 120. The second III-V semiconductor layer 130 is formed by using the PE-ALD with the in-situ plasma treatment as set forth above.

In some embodiments, the second III-V semiconductor layer 130 has a larger band gap energy than the first III-V semiconductor layer 115 (fin 120). In certain embodiments, the first III-V semiconductor layer 115 (fin 120) is made of GaN, and the second III-V semiconductor layer 130 is made of $Al_xGa_{(1-x)}N$, where $0<x<1$. The $Al_xGa_{(1-x)}N$ layer includes M1 mono-layers of AlN and M2 mono-layers of GaN and $x=M1/(M1+M2)$.

The thickness of the second III-V semiconductor layer 130 is in a range from about 10 nm to about 100 nm in some embodiments.

Figure 23:
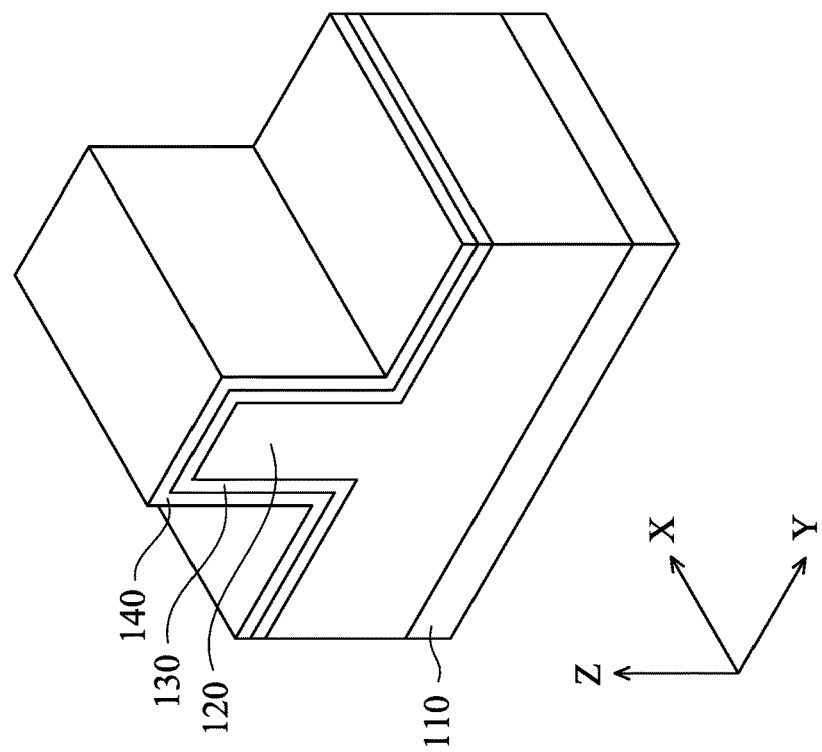
FIG. 23 shows a cross sectional view of one of the various stages for manufacturing a III-V semiconductor FET device according to an embodiment of the present disclosure.

After the second III-V semiconductor layer is formed, a gate dielectric layer 140 is formed on the second III-V semiconductor layer 130, as shown in FIG. 23. The gate dielectric layer 140 includes one or more layers of $Al_2O_3$, $SiO_2$, SiN, $HfO_2$, $ZrO_2$, $Ta_2O_5$ and $Ga_2O_3$. The gate dielectric layer 140 may be formed by chemical vapor deposition (CVD), physical vapor deposition (PVD) and/or ALD. The thickness of the gate dielectric layer 140 is in a range from about 1 nm to about 50 nm in some embodiments.

Figure 24:
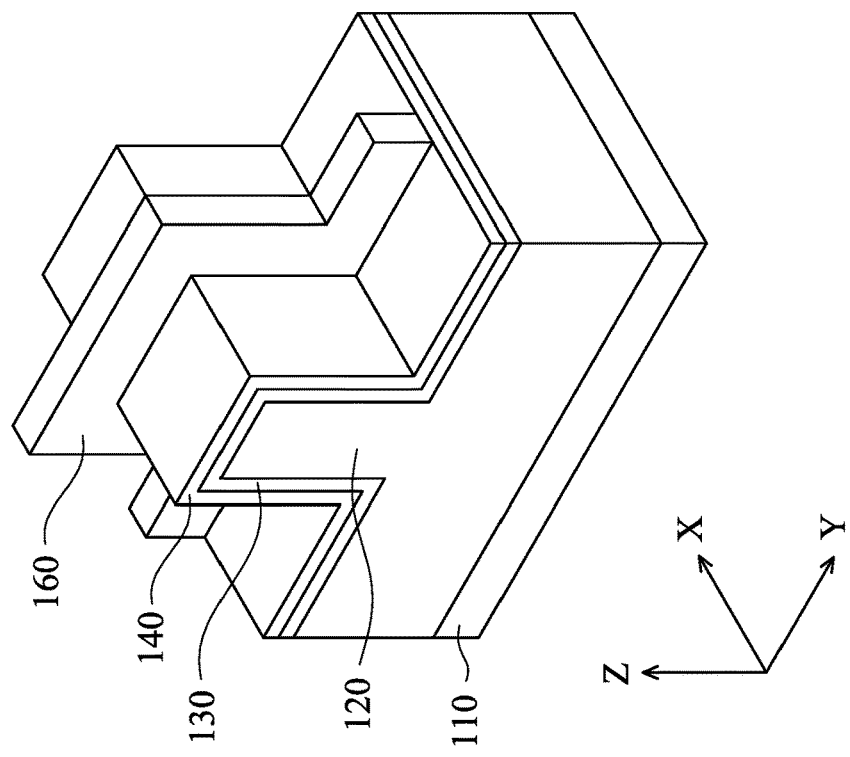
FIG. 24 shows a cross sectional view of one of the various stages for manufacturing a III-V semiconductor FET device according to an embodiment of the present disclosure.
Figure 26:
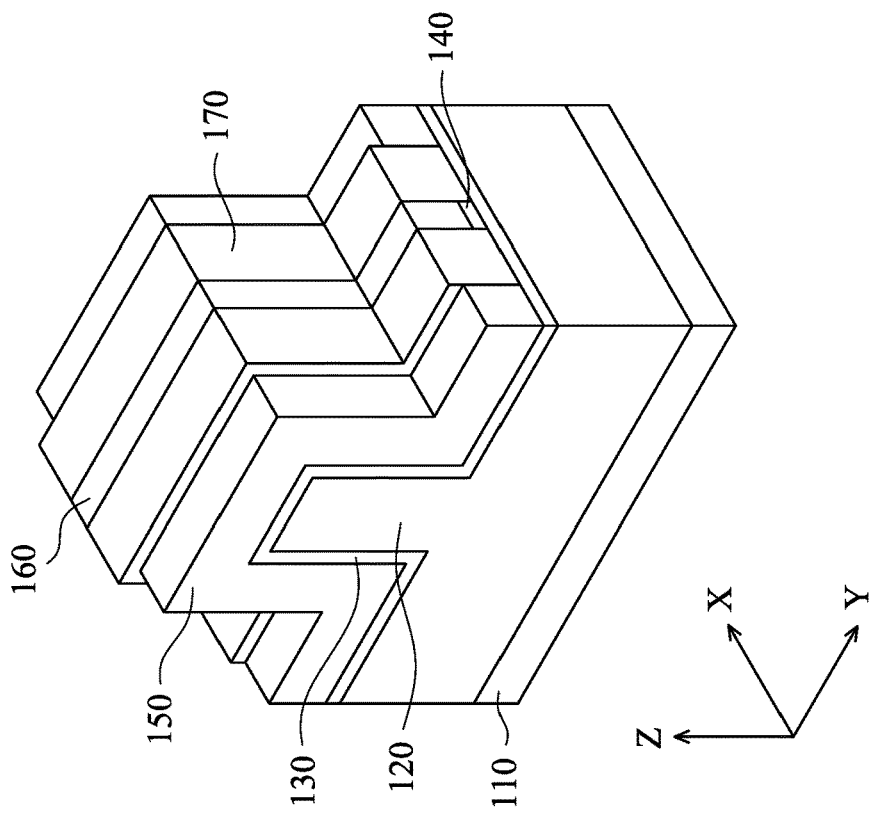
FIG. 26 shows a cross sectional view of one of the various stages for manufacturing a III-V semiconductor FET device according to an embodiment of the present disclosure.
Figure 25:
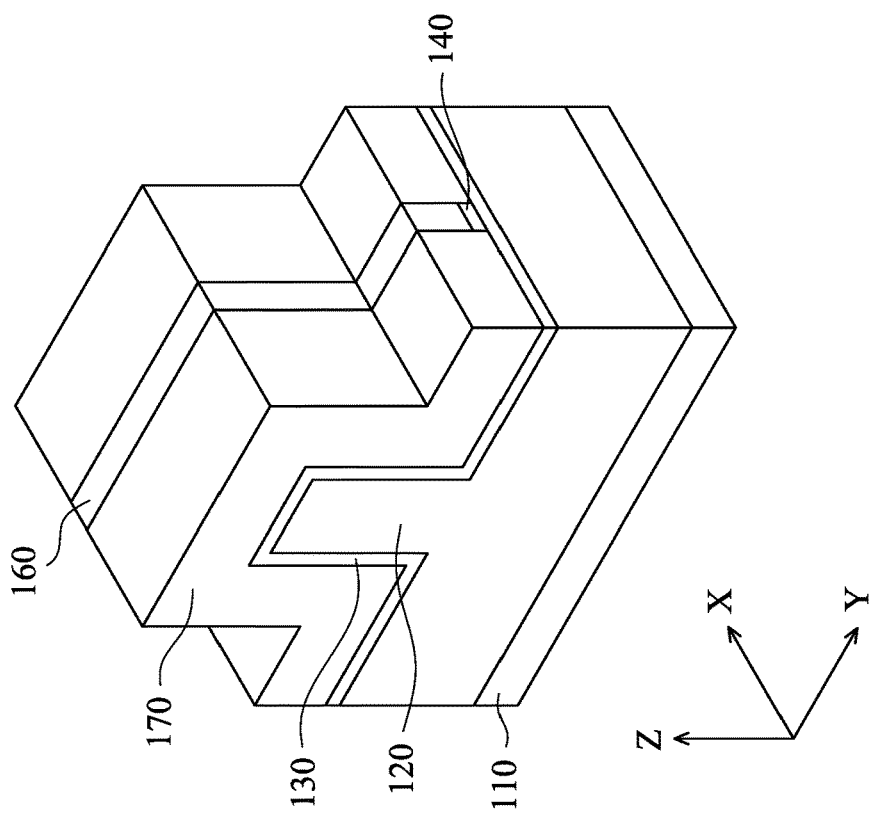
FIG. 25 shows a cross sectional view of one of the various stages for manufacturing a III-V semiconductor FET device according to an embodiment of the present disclosure.

After the gate dielectric layer 140 is formed, a gate electrode 160 is formed as shown in FIG. 24. A blanket layer of a conductive material is formed on the gate dielectric layer 140, and a patterning operation is performed to define the gate electrode 160. The gate electrode 160 is at least one of Cr, Ni, Au, Ti, Pt, TiN, TaN and an alloy of Ni/Au and Cr/Au in some embodiments Then, as shown in FIG. 25, a spacer dielectric layer 170 is formed. One or more layers of insulating materials such as silicon oxide, silicon oxynitride or silicon nitride, are formed by LPCVD, plasma-CVD or flowable CVD, as the spacer dielectric layer 170. Then, the spacer dielectric layer 170 is patterned to form source/drain openings and the source/drain openings are filled with a conductive material, thereby forming source/drain electrodes 150, as shown in FIG. 26. The conductive material for the source/drain electrode 150 is at least one of Ti, Al, Ni and Au and an alloy thereof. The source/drain electrode 150 is in contact with the second III-V semiconductor layer 130.

Figure 28:
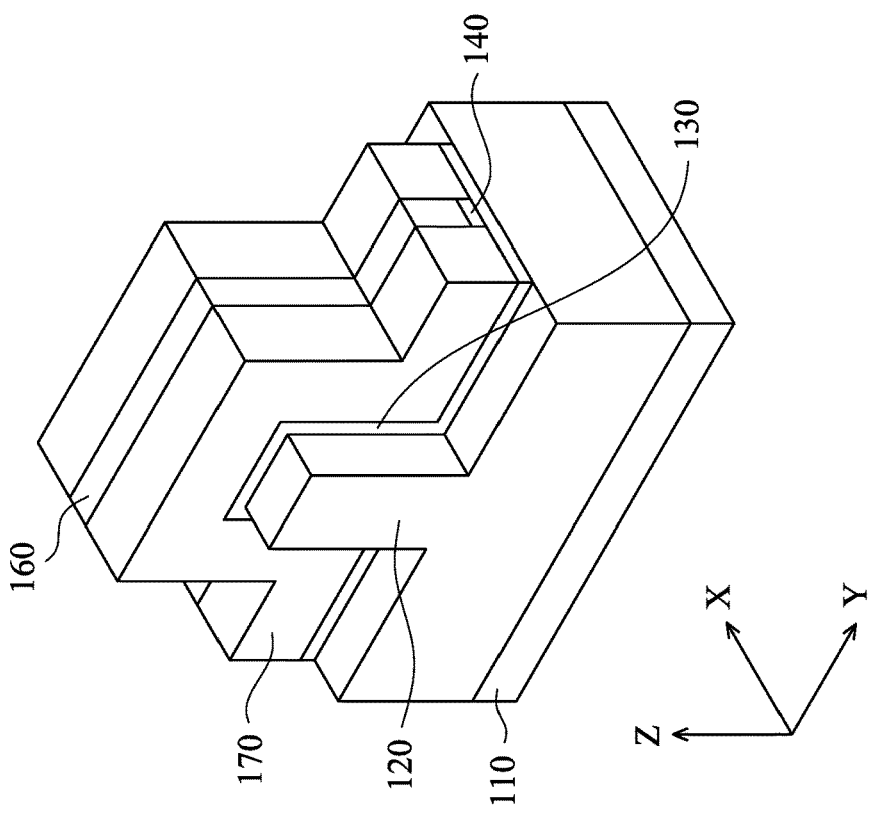
FIG. 28 shows a cross sectional view of one of the various stages for manufacturing a III-V semiconductor FET device according to an embodiment of the present disclosure.
Figure 27:
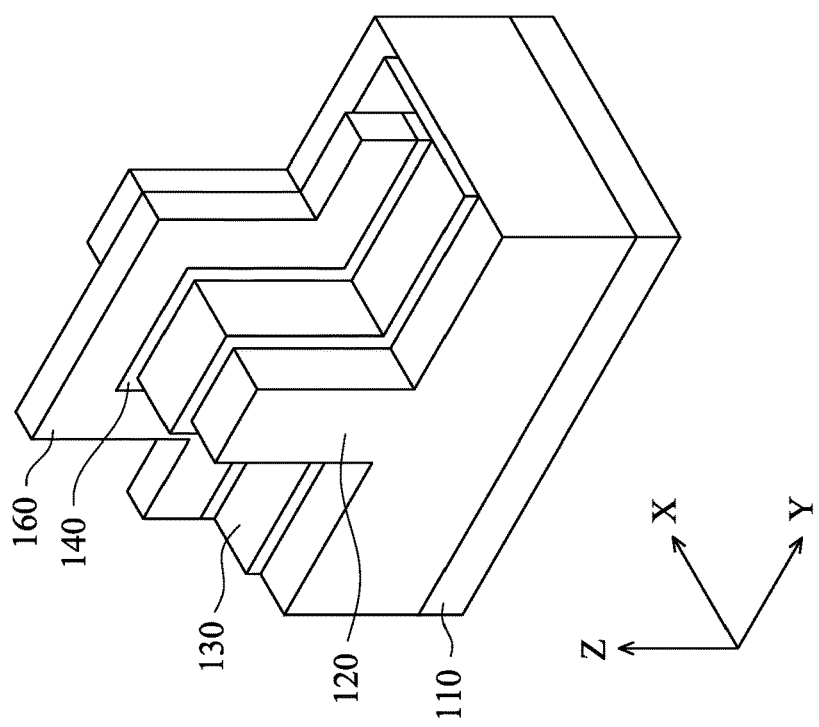
FIG. 27 shows a cross sectional view of one of the various stages for manufacturing a III-V semiconductor FET device according to an embodiment of the present disclosure.
Figure 29:
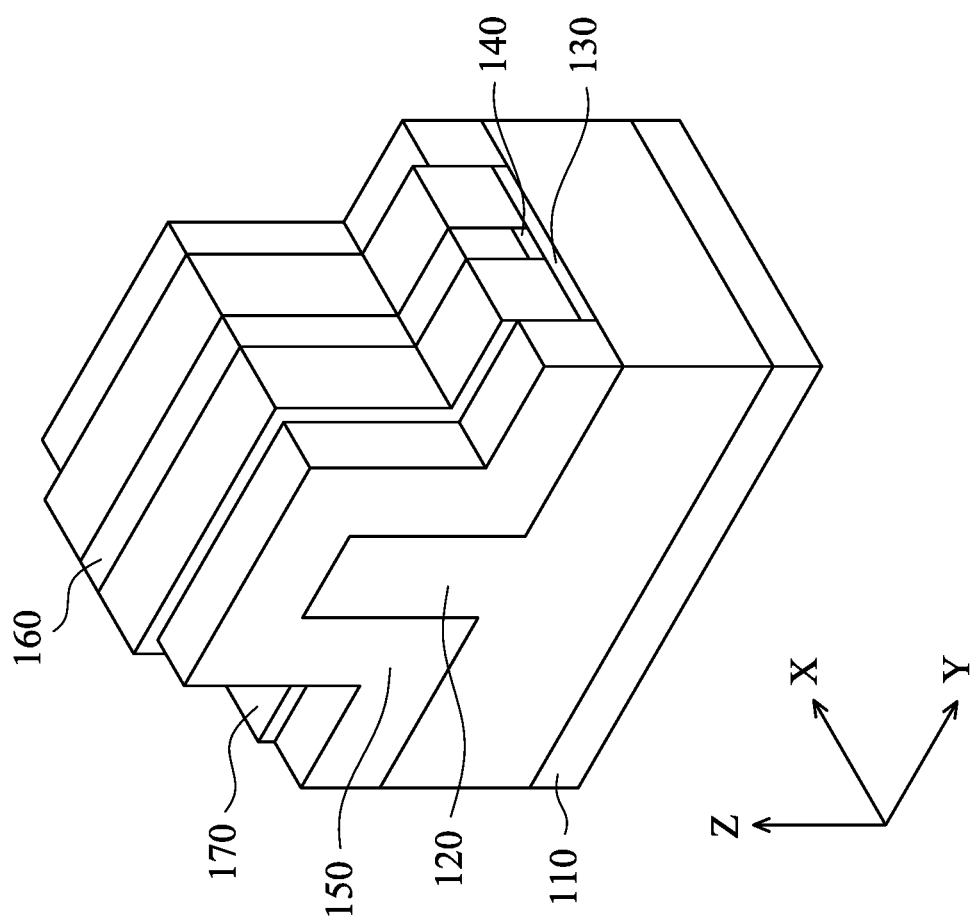
FIG. 29 shows a cross sectional view of one of the various stages for manufacturing a III-V semiconductor FET device according to an embodiment of the present disclosure.

FIGS. 27-29 show exemplary cross sectional views of various stages for manufacturing a III-V semiconductor FET device according to an embodiment of the present disclosure. Materials, configurations, operations and structures same as or similar to the foregoing embodiments may be applied to the following embodiments, and the detailed explanation may be omitted.

After the gate electrode 160 is formed as shown in FIG. 24, the gate dielectric layer 140 is etched as shown in FIG. 27. In some embodiment, the second III-V semiconductor layer 130 is also selectively etched.

Then, the spacer dielectric layer 170 is formed, and source/drain openings are formed to expose the first III-V semiconductor layer 120 as shown in FIG. 28.

Then, the source/drain openings are filled with a conductive material, thereby forming source/drain electrodes 150, as shown in FIG. 29. The source/drain electrode 150 is in contact with the first and second III-V semiconductor layers.

It will be understood that not all advantages have been necessarily discussed herein, no particular advantage is required for all embodiments or examples, and other embodiments or examples may offer different advantages.

An $Al_xGa_{1-x}N$/GaN hetero-structure formed by using the PE-ALD with in-situ plasma treatment can be applied in Fin-HEMTs. The high conformal deposition of the PE-ALD process leads to a high step coverage of the $Al_xGa_{1-x}N$ layer upon the GaN nano-scale fin.

According to the embodiments of the present disclosure, the $Al_xGa_{1-x}N$ layer grown by PE-ALD with the in-situ plasma treatment on the GaN epi-layer is well crystallized and exhibits significant 2DEG characteristics. The growth process can be carried out at a relatively low deposition temperature (e.g., 200-800° C. or 250-350° C.). The $Al_xGa_{1-}$ $_x$N layer grown by PE-ALD exhibits excellent step coverage when deposited on the GaN nano-scale fin. Thus, all the sidewalls of the GaN nano-scale fin can be surrounded by the $Al_xGa_{1-x}N$ layer, thereby creating additional 2DEG layers near the side surfaces of the GaN fin, thereby improving electronic properties. The PE-ALD process exhibits good step coverage, reliability and uniformity in large area.

In accordance with one aspect of the present disclosure, in a method of manufacturing a high-electron mobility transistor (HEMT), a first Group III-V semiconductor layer is formed on a substrate. The first Group III-V semiconductor layer is patterned to form a fin and a recessed surface. A second Group III-V semiconductor layer is formed to cover a top surface and all side surfaces of the fin and the recessed surface. The second Group III-V semiconductor layer is formed by a plasma-enhanced atomic layer deposition, in which a plasma treatment is performed on every time an as-deposited mono-layer is formed. In one or more forging or following embodiments, the second Group III-V semiconductor layer is a barrier layer to the first Group III-V semiconductor layer. In one or more forging or following embodiments, the first Group III-V semiconductor layer is GaN and the second Group III-V semiconductor layer is $Al_xGa_{1-x}N$, where $0<x<1$. In one or more forging or following embodiments, the method further includes the following operations. A gate dielectric layer is formed on the second Group III-V semiconductor layer, a gate electrode is formed, and a source electrode and a drain electrode are formed. In one or more forging or following embodiments, the plasma-enhanced atomic layer deposition includes: performing (A) one or more times and performing (B) one or more times. (A) includes forming a first mono-layer of a first semiconductor material by: (a-1): providing a first source material over a substrate; (b-1): after (a-1), purging the substrate with a non-reactive gas; (c-1): after (b-1), providing a second source material over the substrate, thereby forming a first as-deposited mono-layer of the first semiconductor material; (d-1): after (c-1), purging the substrate with a non-reactive gas; and (e-1): after (d-1), treating the first as-deposited mono-layer with plasma, thereby forming the first mono-layer of the first semiconductor material. (B) includes forming a second mono-layer of a second semiconductor material by: (a-2): providing a third source material over the substrate; (b-2): after (a-2), purging the substrate with a non-reactive gas; (c-2): after (b-2), providing a fourth source material over the substrate, thereby forming a second as-deposited mono-layer of the second semiconductor material; (d-2): after (c-2), purging the substrate with a non-reactive gas; and (e-2): after (d-2), treating the second as-deposited first mono-layer with plasma, thereby forming the second mono-layer of the second semiconductor material. In one or more forging or following embodiments, a source gas of the plasma for treating the first and second mono-layers in (e-1) and (e-2) includes at least one of Ar, He, Ne and $N_2$. In one or more forging or following embodiments, the first Group III-V semiconductor layer is GaN epitaxially formed on a GaN layer. In one or more forging or following embodiments, the method further includes forming a source electrode and a drain electrode in contact with the barrier layer. In one or more forging or following embodiments, the source electrode and the drain electrode are in contact with the first Group III-V semiconductor layer.

In accordance with another aspect of the present disclosure, in a method of manufacturing a high-electron mobility transistor (HEMT), a Group III-V semiconductor layer is formed over a substrate as an operation (A). As an operation (B), on the Group III-V semiconductor layer, a first mono-layer of a first semiconductor material by the following sub-operations (a-1) to (e-1). In (a-1), a first source material is provided over a substrate. In (b-1), after (a-1), the substrate is purged with a non-reactive gas. In (c-1), after (b-1), a second source material is provided over the substrate, thereby forming a first as-deposited mono-layer of the first semiconductor material. In (d-1), after (c-1), the substrate is purged with a non-reactive gas. In (e-1), after (d-1), the first as-deposited mono-layer is treated with plasma, thereby forming the first mono-layer of the first semiconductor material. In one or more forging or following embodiments, on the first mono-layer, a second mono-layer of a second semiconductor material is formed, as operation (C) by the following sub-operations (a-2) to (e-2). In (a-2), a third source material is provided over the substrate. In (b-2), after (a-2), the substrate is purged with a non-reactive gas. In (c-2), after (b-2), a fourth source material is provided over the substrate, thereby forming a second as-deposited mono-layer of the second semiconductor material. In (d-2), after (c-2), the substrate is purged with a non-reactive gas. In (e-2), after (d-2), the second as-deposited first mono-layer is treated with plasma, thereby forming the second mono-layer of the second semiconductor material. In one or more forging or following embodiments, the operation (B) is repeated more than one time, and the operation (C) is repeated more than one time, thereby forming a barrier layer on the first Group III-V semiconductor layer. In one or more forging or following embodiments, the third source material is one of trimethylaluminium, triethylaluminium, trimethylgallium, triethylgallium, trimethylindium, triethylindium, di-isopropylmethylindium, and ethyldimethylindium. In one or more forging or following embodiments, the fourth source material includes at least one of $N_2$, a mixed gas of $N_2$ and $H_2$, and $NH_3$ in a form of plasma. In one or more forging or following embodiments, a total number of repetitions of the operation (B) is equal to a total number of repetitions of the operation (C). In one or more forging or following embodiments, a total number of repetitions of the operation (B) is different from a total number of repetitions of (C). In one or more forging or following embodiments, the first source material is one of trimethylaluminium, triethylaluminium, trimethylgallium, triethylgallium, trimethylindium, triethylindium, di-isopropylmethylindium, and ethyldimethylindium. In one or more forging or following embodiments, the second source material includes at least one of $N_2$, a mixed gas of $N_2$ and $H_2$, and $NH_3$ in a form of plasma. In one or more forging or following embodiments, a source gas of the plasma for treating the first mono-layer in (e-1) includes at least one of Ar, He, Ne and $N_2$. In one or more forging or following embodiments, in (a-1) to (e-1), the substrate is heated at a temperature in a range from 200-800° C. In one or more forging or following embodiments, the Group III-V semiconductor layer is an epitaxially formed GaN layer. In one or more forging or following embodiments, the non-reactive gas for purging in (b-1) and (d-1) includes at least one of Ar, He, Ne and $N_2$. In one or more forging or following embodiments, the method further includes forming a source electrode and a drain electrode in contact with the barrier layer. In one or more forging or following embodiments, the source electrode and the drain electrode are in contact with the III-V semiconductor layer.

In accordance with another aspect of the present disclosure, a semiconductor device includes a fin structure disposed over a substrate and formed by a first Group III-V semiconductor; a second Group III-V semiconductor layer formed to cover a top surface and all side surfaces of the fin structure; a gate dielectric layer formed on the second Group III-V semiconductor layer; a gate electrode formed on the gate dielectric layer; and a source electrode and a drain electrode. The second Group III-V second semiconductor layer is a different material than the first Group III-V semiconductor.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a high-electron mobility transistor (HEMT), the method comprising:
   forming a first Group III-V semiconductor layer on a substrate;
   patterning the first Group III-V semiconductor layer to form a fin and a recessed surface; and
   forming a second Group III-V semiconductor layer to cover a top surface and all side surfaces of the fin and the recessed surface,
   wherein the second Group III-V semiconductor layer is formed by a plasma-enhanced atomic layer deposition, in which a plasma treatment is performed on every time an as-deposited mono-layer is formed.

2. The method of claim 1, wherein the second Group III-V semiconductor layer is a barrier layer to the first Group III-V semiconductor layer.

3. The method of claim 2, wherein the first Group III-V semiconductor layer is GaN and the second Group III-V semiconductor layer is $Al_xGa_{1-x}N$, where $0<x<1$.

4. The method of claim 3, further comprising:
   forming a gate dielectric layer on the second Group III-V semiconductor layer;
   forming a gate electrode; and
   forming a source electrode and a drain electrode.

5. The method of claim 3, wherein the plasma-enhanced atomic layer deposition includes:
   performing (A) one or more times and performing (B) one or more times:
   (A) forming a first mono-layer of a first semiconductor material by:
   (a-1): providing a first source material over a substrate;
   (b-1): after (a-1), purging the substrate with a non-reactive gas;
   (c-1): after (b-1), providing a second source material over the substrate, thereby forming a first as-deposited mono-layer of the first semiconductor material;
   (d-1): after (c-1), purging the substrate with a non-reactive gas; and
   (e-1): after (d-1), treating the first as-deposited mono-layer with plasma, thereby forming the first mono-layer of the first semiconductor material, and (B) forming a second mono-layer of a second semiconductor material by:
   (a-2): providing a third source material over the substrate;
   (b-2): after (a-2), purging the substrate with a non-reactive gas;
   (c-2): after (b-2), providing a fourth source material over the substrate, thereby forming a second as-deposited mono-layer of the second semiconductor material;
   (d-2): after (c-2), purging the substrate with a non-reactive gas; and
   (e-2): after (d-2), treating the second as-deposited first mono-layer with plasma, thereby forming the second mono-layer of the second semiconductor material.

6. The method of claim 5, wherein a source gas of the plasma for treating the first and second mono-layers in (e-1) and (e-2) includes at least one of Ar, He, Ne and $N_2$.

7. The method of claim 3, wherein the first Group semiconductor layer is GaN epitaxially formed on a GaN layer.

8. The method of claim 3, further comprising forming a source electrode and a drain electrode in contact with the barrier layer.

9. The method of claim 8, wherein the source electrode and the drain electrode are in contact with the first Group III-V semiconductor layer.

10. A method of manufacturing a high-electron mobility transistor (HEMT), the method comprising:
    (A) forming a Group III-V semiconductor layer over a substrate;
    (B) forming, on the Group III-V semiconductor layer, a first mono-layer of a first semiconductor material by:
    (a-1): providing a first source material over a substrate;
    (b-1): after (a-1), purging the substrate with a non-reactive gas;
    (c-1): after (b-1), providing a second source material over the substrate, thereby forming a first as-deposited mono-layer of the first semiconductor material;
    (d-1): after (c-1), purging the substrate with a non-reactive gas; and
    (e-1): after (d-1), treating the first as-deposited mono-layer with plasma, thereby forming the first mono-layer of the first semiconductor material.

11. The method of claim 10, further comprising:
    (C) forming, on the first mono-layer, a second mono-layer of a second semiconductor material by:
    (a-2): providing a third source material over the substrate;
    (b-2): after (a-2), purging the substrate with a non-reactive gas;
    (c-2): after (b-2), providing a fourth source material over the substrate, thereby forming a second as-deposited mono-layer of the second semiconductor material;
    (d-2): after (c-2), purging the substrate with a non-reactive gas; and
    (e-2): after (d-2), treating the second as-deposited first mono-layer with plasma, thereby forming the second mono-layer of the second semiconductor material.

12. The method of claim 11, wherein (B) is repeated more than one time, and (C) is repeated more than one time, thereby forming a barrier layer on the Group III-V semiconductor layer.

13. The method of claim 12, wherein:
    the Group III-V semiconductor layer is GaN epitaxially formed on a GaN layer, and
    the barrier layer is $Al_xGa_{1-x}N$, where $0<x<1$.

14. The method of claim 11, wherein the third source material is one of trimethylaluminium, triethylaluminium, trimethylgallium, triethylgallium, trimethylindium, triethylindium, di-isopropylmethylindium, and ethyldimethylindium.

15. The method of claim 11, wherein the fourth source material includes at least one of $N_2$, a mixed gas of $N_2$ and $H_2$, and $NH_3$ in a form of plasma.

16. The method of claim 11, wherein a total number of repetitions of (B) is equal to a total number of repetitions of (C).

17. The method of claim 11, wherein a total number of repetitions of (B) is different from a total number of repetitions of (C).

18. The method of claim 11, wherein a source gas of the plasma for treating the first mono-layer in (e-1) includes at least one of Ar, He, Ne and $N_2$.

19. The method of claim 11, wherein in (a1) to (e-1), the substrate is heated at a temperature in a range from 200-800° C.

* * * * *